(12) United States Patent
Koyama

(10) Patent No.: US 8,896,025 B2
(45) Date of Patent: Nov. 25, 2014

(54) METHOD FOR FABRICATING SEMICONDUCTOR DEVICE

(75) Inventor: Masatoshi Koyama, Kanagawa (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 288 days.

(21) Appl. No.: 13/182,124

(22) Filed: Jul. 13, 2011

(65) Prior Publication Data

US 2012/0015513 A1  Jan. 19, 2012

(30) Foreign Application Priority Data

Jul. 14, 2010 (JP) .................................. 2010-160119

(51) Int. Cl.
| | |
|---|---|
| H01L 21/02 | (2006.01) |
| H01L 29/45 | (2006.01) |
| H01L 29/66 | (2006.01) |
| H01L 21/306 | (2006.01) |
| H01L 29/20 | (2006.01) |

(52) U.S. Cl.
CPC ....... *H01L 21/30621* (2013.01); *H01L 29/2003* (2013.01); *H01L 29/452* (2013.01); *H01L 29/66462* (2013.01)
USPC ........................................................ 257/190

(58) Field of Classification Search
None
See application file for complete search history.

(56) References Cited

U.S. PATENT DOCUMENTS

| 7,879,147 B2* | 2/2011 | Xu et al. .................... 117/88 |
| 8,080,833 B2* | 12/2011 | Grandusky et al. ........... 257/190 |
| 2005/0156189 A1* | 7/2005 | Deguchi et al. .............. 257/103 |
| 2007/0018316 A1 | 1/2007 | Nakayama et al. |
| 2008/0035949 A1* | 2/2008 | Fudeta et al. ................. 257/99 |
| 2010/0176421 A1* | 7/2010 | Van Hove et al. ............ 257/194 |

FOREIGN PATENT DOCUMENTS

| JP | 2003-124188 A | 4/2003 |
| JP | 2006-165207 A | 6/2006 |
| JP | 2006-173386 A | 6/2006 |
| JP | 2007-273844 A | 10/2007 |
| JP | 2009-194081 A | 8/2009 |
| WO | 2005/057641 A1 | 6/2005 |

OTHER PUBLICATIONS

Japanese Office Action dated Jul. 15, 2014, issued in corresponding Japanese Patent Application No. 2010-160119 with English translation (6 pages).

* cited by examiner

*Primary Examiner* — Charles Garber
*Assistant Examiner* — Andre' C Stevenson
(74) *Attorney, Agent, or Firm* — Westerman, Hattori, Daniels & Adrian, LLP

(57) ABSTRACT

A method for fabricating a semiconductor device includes forming a recess to an AlGaN layer by etching, the AlGaN layer having an Al composition ratio of 0.2 or greater, the recess having a bottom having an RMS roughness less than 0.3 nm, forming a first Ta layer having a thickness of 4 nm to 8 nm on the bottom of the recess, and annealing the first Ta layer to make an ohmic contact in the AlGaN layer.

16 Claims, 3 Drawing Sheets

US 8,896,025 B2

METHOD FOR FABRICATING SEMICONDUCTOR DEVICE

CROSS-REFERENCE TO RELATED APPLICATION

This application is based upon and claims the benefit of priority of the prior Japanese Patent Application No. 2010-160119 filed on Jul. 14, 2010, the entire contents of which are incorporated herein by reference.

BACKGROUND (i) Technical Field

A certain aspect of the embodiments discussed herein is related to a method for fabricating a semiconductor device.

(ii) Related Art

Nitride semiconductors are used for power devices capable of operating at high frequencies and outputting high power. An electrode formed on a nitride semiconductor layer is an ohmic electrode for making a good electrical contact (see Japanese Patent Application Publication No. 2006-173386.

High-power devices using nitride semiconductors are required to have a small contact resistance of the ohmic electrode in order to improve the power efficiency. The contact resistance may be reduced by forming the ohmic electrode in a recess formed in the semiconductor nitride layer. However, in a case where the recess is formed by etching, the bottom of the recess may get rough. The rough bottom of the recess increases the contact resistivity of the ohmic electrode.

SUMMARY

According to an aspect of the present invention, there is provided a method for fabricating a semiconductor device including: forming a recess to an AlGaN layer by etching, the AlGaN layer having an Al composition ratio of 0.2 or greater, the recess having a bottom having an RMS roughness less than 0.3 nm; forming a first Ta layer having a thickness of 4 nm to 8 nm on the bottom of the recess; and annealing the first Ta layer to make an ohmic contact in the AlGaN layer.

DETAILED DESCRIPTION

Figure 1:
FIG. 1 is a schematic cross-sectional view of an AlGaN layer having a recess.

First, a description is given of a problem to be solved by an aspect of the present invention. FIG. 1 is a schematic cross-sectional view of an AlGaN layer having a recess. Referring to FIG. 1, a recess 54 having a predetermined thickness is formed in a specific area of an AlGaN layer 52 on a channel layer 50 by plasma etching. The specific area is an area in which an ohmic electrode is to be formed. In other words, the recess 54 is formed by plasma etching so that the distance between the bottom of the recess 54 and the channel layer 50 has a predetermined value. In the process of forming the recess 54, there is a possibility that a roughness may be formed on the bottom of the recess 54 under an etching condition or in the use of a particular material to be etched.

If the bottom of the recess 54 is rough, the distance between the bottom of the recess 54 and the channel layer 50 may vary greatly. For example, the distance between the bottom of the recess 54 and the channel layer 50 may be greater than the predetermined value. It is conceivable that a comparatively long distance D1 between the bottom of the recess 54 and the channel layer 50 results in a thick tunnel barrier and increases the contact resistance. Thus, the average contact resistance in plane may be larger than a target contact resistance. According to an aspect of embodiments, the contact resistivity can be suppressed to a low level.

(First Embodiment)

FIGS. 2A through 2D are schematic cross-sectional views that illustrate a method for fabricating a semiconductor device (for example, HEMT) in accordance with a first embodiment. Referring to FIG. 1A, on a substrate 10 formed of, for example, sapphire ($Al_2O_3$), there are epitaxially stacked a seed layer 12, a GaN (gallium nitride) channel layer 14, an AlGaN electron supply layer 16, and a GaN cap layer 18 in this order by MOCVD (Metal Organic Chemical Vapor Deposition). The seed layer 12 is made of AlN (aluminum nitride). A channel layer 36 is formed by 2 DEG (2-Dimensional Electron Gas) at an interface between the GaN channel layer 14 and the AlGaN electron supply layer 16. Besides the sapphire substrate, the substrate may be a SiC (silicon carbide) or a Si (silicon) substrate. The seed layer 12 may be 300 nm thick, for example. The GaN channel layer 14 may be 1000 nm thick, for example. The AlGaN electron supply layer 16 may be 20 nm thick, for example. The GaN cap layer 18 may be 4 nm thick, for example. The Al composition ratio of the AlGaN electron supply layer 16 is, for example, 0.24.

Figure 2A:
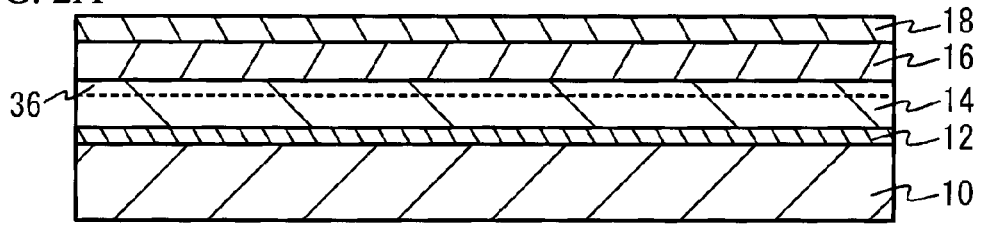
FIGS. 2A through 2D are schematic cross-sectional views that illustrate a method for fabricating a semiconductor device in accordance with a first embodiment.
Figure 2B:
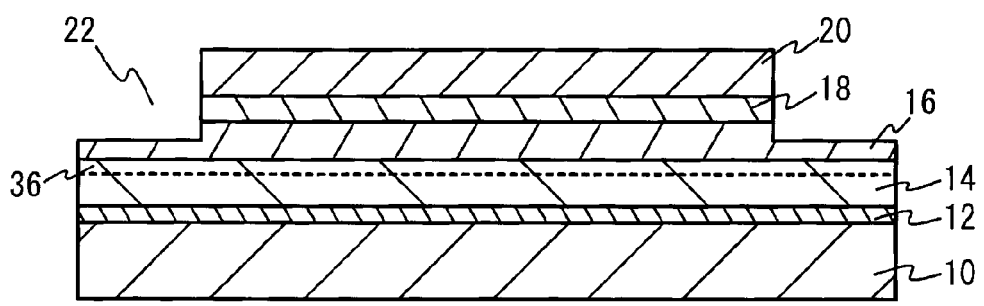

Referring to FIG. 2B, a photoresist 20 having widows located in areas in which source and drain electrodes are to be formed is formed on the GaN cap layer 18. By using the photoresist 20 as a mask, the GaN cap layer 18 and the AlGaN electron supply layer 16 are partly etched by plasma etching to form recesses 22. The bottoms of the recesses 22 are exposed portions of the AlGaN electron supply layer 16. The plasma etching uses a mixed gas of $BCl_3$ (boron chloride) gas and $Cl_2$ (chlorine) gas by ICP (Inductive Coupled Plasma). The flow rate of $BCl_3$ is 3 sccm, and the flow rate of $Cl_2$ is 30 sccm. The RF power is 70 W and the bias is 15 W at a pressure of 0.5 Pa. Table 1 indicates an exemplary etching condition. Besides ICP, RIE (Reactive Ion Etching) may be used.

TABLE 1

| Etching Gas | $BCl_3/Cl_2$ |
|---|---|
| Flow Rate [sccm] | 3/30 |
| Pressure [Pa] | 0.5 |
| RF Power [W] | 70 |
| Bias [W] | 15 |

Figure 2C:
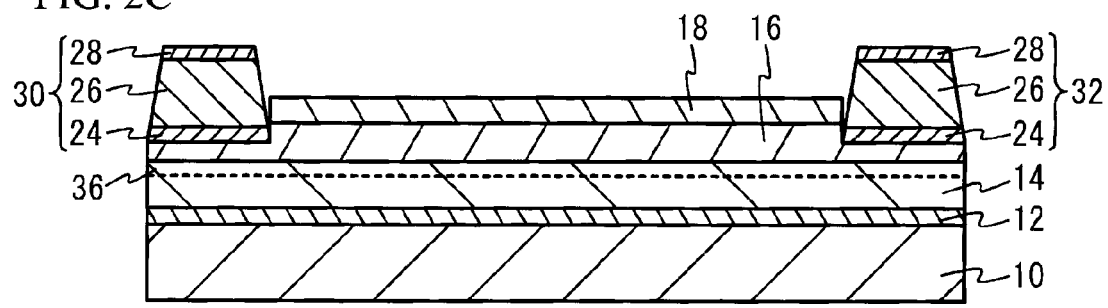

As illustrated in FIG. 2C, a source electrode 30 and a drain electrode 32 are formed so as to contact the bottoms of the recesses 22 by an evaporating deposition method and liftoff method. Each of the source electrode 30 and the drain electrode 32 has a three-layer structure composed of a first Ta (tantalum) layer 24, an Al (Aluminum) layer 26 and a second Ta layer 28. The first Ta layer 24 contacts the bottom of the corresponding recess 22, and has a thickness of, for example, 8 nm. The Al layer 26 has a thickness of, for example, 350 nm, and the second Ta layer 28 has a thickness of, for example, 10 nm. Then, the three-layer structures are annealed at 550° C. to form ohmic contacts of the source electrode 30 and the drain electrode 32 that are in ohmic contact with the AlGaN electron supply layer 16. The anneal temperature is not limited to 550° C. but may be between 500° C. and 600° C.

Figure 2D:
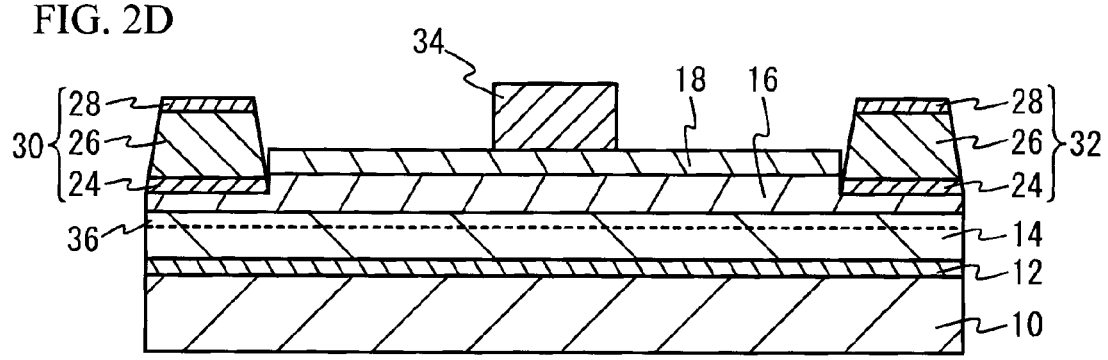

As illustrated in FIG. 2D, a gate electrode 34 is formed so as to contact the upper surface of the AlGaN electron supply layer 16 between the source electrode 30 and the drain electrode 32 by the evaporating deposition method and the liftoff method. The gate electrode 34 has a two-layer structure composed of Ni (nickel) and Au (gold) stacked in this order from the AlGaN electron supply layer 16. Through the above steps, the semiconductor device of the first embodiment is fabricated.

A description is now given of the states of the bottoms of the recesses 22 after the step of FIG. 2B is performed. For comparison with the first embodiment, there were prepared semiconductor devices in accordance with first and second comparative examples, and a description is additionally given of the states of the bottoms of the recesses 22 of these semiconductors. The method for evaluating the states of the bottoms of the recesses 22 was a root means square roughness (RMS roughness), which is a general index for evaluation of the surface roughness. The RMS roughness was measured within a range of 0.5 μm×1.0 μm, which is a part of the bottom of each recess 22.

A description is now given of a method for fabricating the semiconductor devices of the first and second comparative examples. On the substrate 10, there are sequentially stacked the seed layer 12, the GaN channel layer 14, the AlGaN electron supply layer 16, and the GaN cap layer 18. The thickness of each of the stacked layers in each of the first and second comparative example is the same as that of the first embodiment. The Al composition ratio of the AlGaN electron supply layer 16 is 0.24 in the first comparative example (which is the same as the Al composition ratio of the first embodiment), and is 0.2 in the second comparative example.

Next, the recesses 22 are formed by etching the GaN cap layer 18 and a part of the AlGaN electron supply layer 16 by plasma etching (ICP). The etching condition for plasma etching differs from that of the first embodiment, and uses $Cl_2$ gas as etching gas in the first and second comparative examples. Further, the flow rate of $Cl_2$ gas is 30 sccm, the pressure is 0.5 Pa, the RF power is 70 W and the bias is 15 W.

Then, the source electrode 30 and the drain electrode 32, which are ohmic electrodes, are formed in the recesses 22. The layer structures and the thicknesses of the source electrode 30 and the drain electrode 32 in the first and second comparative examples are the same as those of the first embodiment. Also, the anneal temperatures for making an ohmic contact with the AlGaN electron supply layer 16 in the first and second comparative examples are the same as the anneal temperature of the first embodiment.

Finally, the gate electrode 34 is formed on the AlGaN electron supply layer 16. The layer structures of the gate electrode 34 in the first and second comparative examples are the same as that of the first embodiment.

Table 2 shows the results of measurement of the RMS roughness of the bottoms of the recesses 22 in the first embodiment and the first and second comparative example. Further, a description is given of the contact resistivity of the source electrode 30 and the drain electrode 32 that contact the bottoms of the recesses 22. The Al composition ratio in Table 2 is that of the AlGaN electron supply layer 16. A recess depth in Table 2 is the depth from the upper surface of the GaN cap layer 18 to the bottoms of the recesses 22. As shown in Table 2, the RMS roughness of the bottoms of the recesses 22 is 0.3 nm in the first comparative example and is 0.32 nm in the second comparative example. In contrast, the RMS roughness of the bottoms of the recesses 22 in the first embodiment is 0.2 nm, which is smaller than that of the first and second comparative examples. The contact resistivity of the source electrode 30 and the drain electrode 32 is 32 $\mu\Omega\cdot cm^2$ in the first comparative example, and is 16 $\mu\Omega\cdot cm^2$ in the second comparative example. In contrast, the contact resistivity of the source electrode 30 and the drain electrode 32 in the first embodiment is 1.8 $\mu\Omega\cdot cm^2$, which is smaller than that of the first and second comparative examples.

TABLE 2

|  | First Embodiment | 1st Comparative Example | 2nd Comparative Example |
| --- | --- | --- | --- |
| Al Composition Ratio | 0.24 | 0.24 | 0.2 |
| Recess Depth [nm] | 10 | 7 | 7.4 |
| RMS Roughness [nm] | 0.2 | 0.3 | 0.32 |
| Contact Resistivity [$\mu\Omega \cdot cm^2$] | 1.8 | 32 | 16 |

The reason why the RMS roughness of the bottoms of the recesses 22 of the first embodiment is smaller than that of the first and second comparative example may be considered as follows. In the AlGaN electron supply layer 16 having an Al composition ratio of at least 0.2, the surface thereof tends to be oxidized and an aluminum nitride is easily formed thereon. The first and second comparative examples uses $Cl_2$ etching gas in plasma etching for forming the recesses 22 in the AlGaN electron supply layer 16. The $Cl_2$ etching gas is widely used for etching AlGaN. Etching using the $Cl_2$ etching gas is primarily chemical etching using chemical reaction. Thus, aluminum oxide formed on the surface of the AlGaN electron supply layer 16 is hardly etched, and a residue remains thereon. Thus, the first and second comparative examples have large RMS roughness values. In contrast, the first embodiment employs a mixture a mixed gas of $BCl_3$ gas and $Cl_2$ gas as etching gas in plasma etching. By using the $Cl_2$ gas mixed with the $BCl_3$ gas, the function of physical etching is strengthened and the aluminum oxide formed on the surface of the AlGaN electron supply layer 16 is etched. As a result of the above etching, the RMS roughness of the bottoms of the recesses 22 is reduced.

In the case where the RMS roughness of the bottoms of the recesses 22 is as large as 0.3 in the first comparative example and 0.32 in the second comparative example, the distance between the bottoms of the recesses 22 and the upper surface of the channel layer 36 varies greatly. In each recess 22, a portion in which the bottom of the recess 22 is largely away from the channel layer 36, the tunnel barrier is thick and the contact resistance is large. Thus, the first and second comparative examples have large contact resistance values. In contrast, in the case where the RMS roughness of the bottom of the recess 22 is as small as 0.2 in the first embodiment, the distance between the bottom of the recess 22 and the channel layer 36 does not change greatly in plane, and portions having thick tunnel barriers and large contact resistances get fewer. Thus, the contact resistivity is improved. When the RMS roughness of the bottoms of the recesses 22 is equal to or greater than 0.3, the contact resistivity is considerably high. Hence, it is preferable that the RMS roughness of the bottoms of the recesses 22 is not greater than 0.3.

Figure 3:
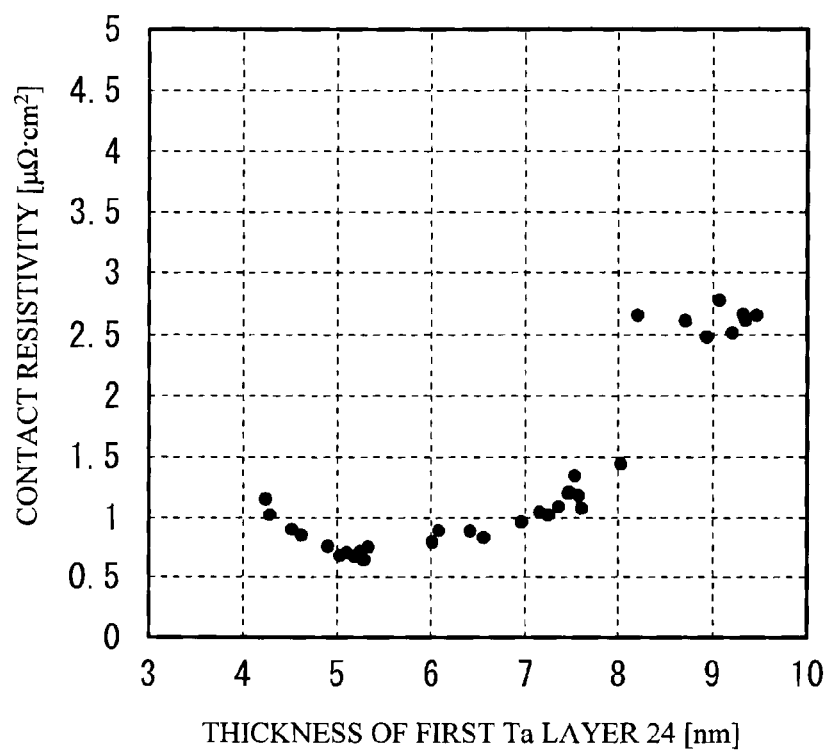
FIG. 3 is a graph of a correlation between the thickness of a first Ta layer and contact resistivity.

The inventors found out that the thickness of the first Ta layer 24 formed in contact with the bottom of each recess 22 as the lowermost layer of the three-layer structure of the source electrode 30 and the drain electrode 32 affects the contact resistivity. FIG. 3 is a graph of a correlation between the thickness of the first Ta layer 24 and the contact resistivity. The semiconductor device used in the measurement in FIG. 3 is the same as that of the first embodiment fabricated by the fabrication method illustrated in FIGS. 2A through 2D except that the thickness of the first Ta layer 24 is varied.

Referring to FIG. 3, when the thickness of the first Ta layer 24 is equal to or greater than 8 nm, the contact resistivity increases drastically. It is conceivable that increase in the thickness of the first Ta layer 24 prevents the Al layer 26 from making a contact with the AlGaN electron supply layer 16. Thus, it is preferable that the first Ta layer 24 is 8 nm thick or less. When the first Ta layer 24 is too thin, the effect of forming N (nitrogen) vacancies on the epitaxial-surface and it becomes difficult to form a Ga (gallium)-rich surface. Thus, the contact resistivity increases. Thus, it is preferable that the first Ta layer 24 is 4 nm thick or greater.

A description is given of an experiment intended to demonstrate that the contact resistivity is reduced by setting the RMS roughness of the bottom of each recess 22 less than 0.3 and setting the thickness of the first Ta layer 24 to 4 nm to 8 nm. In the experiment, semiconductor devices were fabricated under the two different conditions and the contact resistivity of each device was measured.

More particularly, in order to realize a RMS roughness of the bottoms of the recesses 22 of not greater than 0.3, the first fabrication condition used the mixed gas of $BCl_3$ gas and $Cl_2$ gas as etching gas used in plasma etching using ICP. Etching was carried out with the following parameter values.

Flow rate of $BCl_3$ gas: 3 sccm
Flow rate of $Cl_2$ gas: 30 sccm
Pressure: 0.5 Pa
RF power: 70 W
Bias: 15 W.

The Al composition ratio of the AlGaN electron supply layer 16 was 0.2, and the thickness of the first Ta layer 24 was 8 nm. The others are the same as those of the semiconductor device of the first embodiment.

The second fabrication condition used $Cl_2$ gas as etching gas in plasma etching using ICP for forming the recesses 22 as in the case of the first and second comparative examples. Etching was carried out with the following parameter values.

Flow rate of $Cl_2$ gas: 30 sccm
Pressure: 0.5 Pa
RF power: 70 W
Bias: 15 W.

The Al composition ratio of the AlGaN electron supply layer 16 was 0.2, and the thickness of the first Ta layer 24 was 10 nm. The others are the same as those of the semiconductor device of the second comparative example. Since the $Cl_2$ gas was used as etching gas, the RMS roughness of the bottoms of the recesses 22 was equal to or greater than 0.3.

Figure 4:
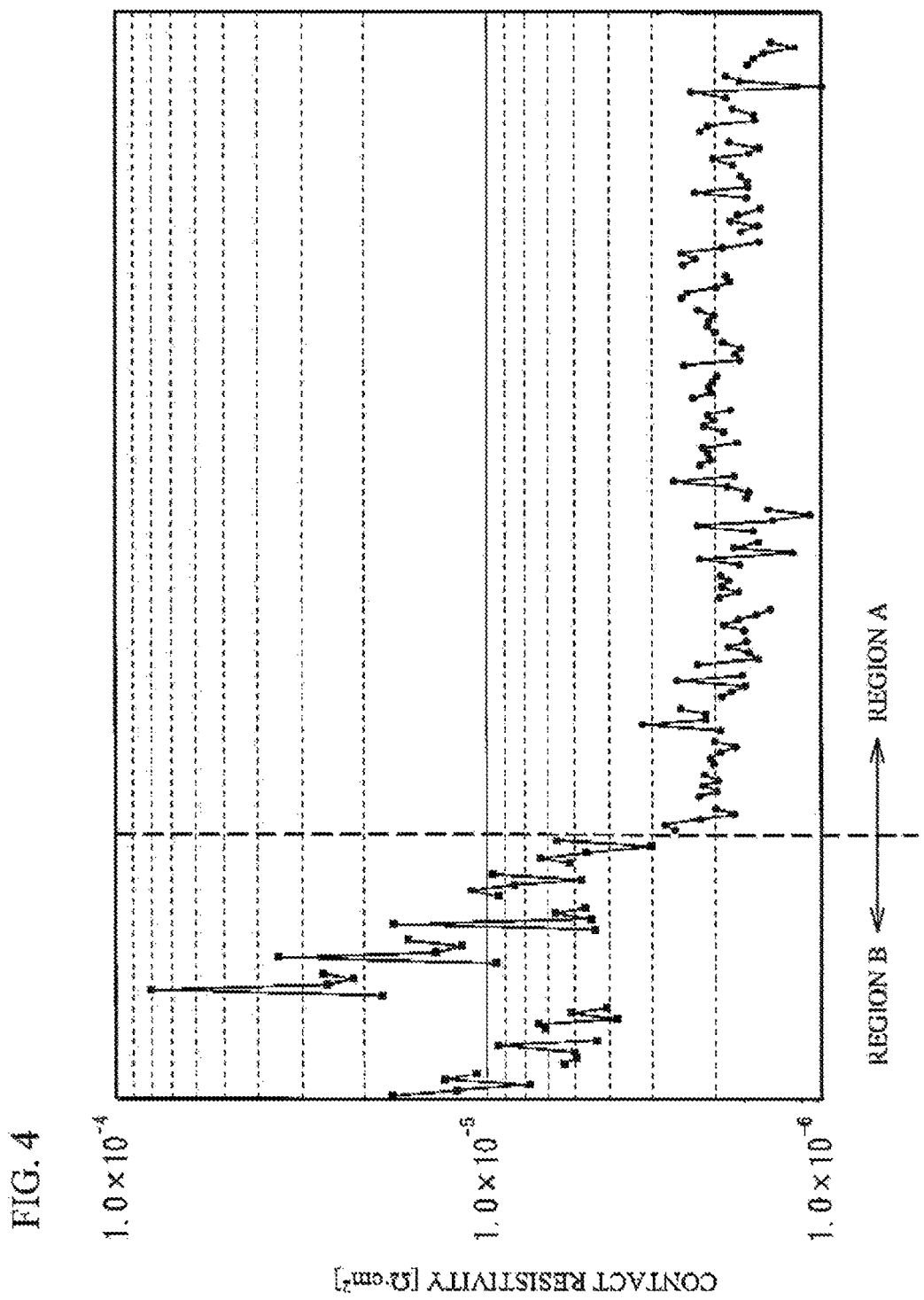
FIG. 4 is a graph of measurement results of the contact resistivity of a semiconductor device fabricated under a different condition.

FIG. 4 is a graph of measurement results of the contact resistivity of the semiconductor devices fabricated under the two conditions. Under each of the two fabrication conditions, multiple substrates were prepared and multiple semiconductor devices were fabricated on each of the multiple substrates. Then, the contact resistivity of five semiconductor devices among the multiple semiconductor devices for each substrate was measured.

Referring to FIG. 4, a region A is a case where the RMS roughness of the bottoms of the recesses 22 is not greater than 0.3 and the thickness of the first Ta layer 24 is 8 nm. A region B is a case where the RMS roughness of the bottoms of the recesses 22 is equal to or greater than 0.3 and the thickness of the first Ta layer 24 is 10 nm. The contact resistivity in the region A is lower than that in the region B. This demonstrates that the contact resistivity can be reduced by setting the RMS roughness of the bottoms of the recesses 22 to not greater than 0.3 and setting the thickness of the first Ta layer 24 to 4 nm to 8 nm.

As described above, according to the first embodiment, as illustrated in FIG. 2B and Table 2, the AlGaN electron supply layer 16 having an Al composition ratio of 0.2 or higher is etched by plasma etching to form the recesses 22 having the bottom having an RMS roughness less than 0.3 nm. As illustrated in FIGS. 2C and 3, the first Ta layer 24 having a thickness of 4 nm to 8 nm is formed so as to contact the bottom of the corresponding recess, and is annealed to make an ohmic contact with the AlGaN electron supply layer 16. It is thus possible to suppress the contact resistivity to a low level, as illustrated in FIG. 4.

As the RMS roughness of the bottoms of the recesses 22 is smaller, the differences in distance between the bottom of each recess 22 and the channel layer 36 in plane become smaller and the contact resistivity becomes lower. The RMS roughness of the bottoms of the recesses 22 is preferably less than 0.25 nm, and is more preferably less than 0.2 nm.

As has been described with reference to FIG. 3, the thickness of the first Ta layer 24 is preferably 4 nm to 8 nm, and is more preferably 5 nm to 7 nm. It is thus possible to further reduce the contact resistivity.

As has been described with reference to Table 2, the mixed gas of $BCl_3$ gas and $Cl_2$ gas in plasma etching for forming the recesses 22 makes it possible to reduce the RMS roughness of the bottoms of the recesses 22 and to improve the contact resistivity.

The three-layer structure of the source electrode 30 and the drain electrode 32 of the first embodiment is not limited to the combination of the first Ta layer 24, the Al layer 26 and the second Ta layer 28 but may have another combination. For example, the second Ta layer 28 may be replaced with a Ti layer.

The first embodiment is not limited to the plasma etching under the condition that the flow rate of $BCl_3$ gas is 3 sccm and the flow rate of $Cl_2$ gas is 30 sccm but may have another condition. The flow rate of $BCl_3$ gas may be in the range of 2 sccm to 200 sccm, and is preferably in the rage of 2 sccm to 100 sccm. More preferably, the flow rate of $BCl_3$ gas is in the range of 2 sccm to 50 sccm. The flow rate of $Cl_2$ gas may be in the range of 5 sccm to 200 sccm, and is preferably in the range of 5 sccm to 100 sccm. More preferably, the flow rate of $Cl_2$ gas is in the range of 5 sccm to 50 sccm.

The pressure may be in the range of 0.2 Pa to 4 Pa, and is preferably in the range of 0.2 Pa to 2 Pa. More preferably, the presume is in the range of 0.2 Pa to 1 Pa. The RF power may be in the range of 20 W to 300 W, and is preferably in the range of 20 W to 200 W. More preferably, the RF power is in the range of 20 W to 100 W. The bias may be in the range of 3 W to 100 W, and is preferably in the range of 3 W to 50 W. More preferably, the RF power is in the range of 3 W to 20 W. It is to be noted that second and third embodiments, which will be described below, have the same preferable ranges of pressure, RF power and bias as those of the first embodiment.

(Second Embodiment)

A second embodiment is an exemplary case where plasma etching using ICP for forming the recesses 22 uses a mixed gas of $BCl_3$ gas, $SiCl_4$ gas (silicon chloride) and $Cl_2$ gas.

A method for a fabricating semiconductor device of the second embodiment uses the mixed gas of $BCl_3$ gas, $SiCl_4$ gas and $Cl_2$ gas in plasma etching for forming the recesses 22 under the condition that the flow rate of $BCl_3$ gas is set to 2 sccm to 200 sccm, the flow rate of $SiCl_4$ gas is set to 2 sccm to 100 sccm, and the flow rate of $Cl_2$ gas is set to 5 sccm to 200 sccm. Further, the pressure is set to 0.2 Pa to 4 Pa, the RF power is set to 20 W to 300 W, and the bias is set to 3 W to 100 W. The parameters other than the above are the same as those of the method of the first embodiment, which have been described with reference to FIGS. 2A through 2D.

As has been described with regard to the first embodiment, the use of the mixed gas of $BCl_3$ gas and $Cl_2$ gas as etching gas realizes an RMS roughness of the bottoms of the recesses 22 as small as not greater than 0.3 because the $BCl_3$ gas strengthens the physical etching function, which etches aluminum oxide formed on the surface of the AlGaN electron supply layer 16. Also, in the second embodiment, the mixed gas of $BCl_3$ and $SiCl_4$ strengthens the physical etching function, which etches aluminum oxide on the surface of the AlGaN electron supply layer 16 and realizes a small RMS roughness of the bottoms of the recesses 22. Thus, the second embodiment is also capable f suppressing the contact resistance to a low level.

In the second embodiment, the flow rate of $BCl_3$ gas is preferably in the range of 2 sccm to 100 sccm, and is more preferably in the range of 2 sccm to 50 sccm. The flow rate of $SiCl_4$ gas is preferably in the range of 2 sccm to 50 sccm, and is more preferably in the range of 2 sccm to 25 sccm. The flow rate of $Cl_2$ is preferably in the range of 5 sccm to 100 sccm, and is more preferably in the range of 5 sccm to 50 sccm.

(Third Embodiment)

A third embodiment is an exemplary case where plasma etching using ICP for forming the recesses 22 uses a mixed gas of $SiCl_4$ and $Cl_2$.

A method for fabricating a semiconductor device of the third embodiment uses the mixed gas of $SiCl_4$ gas and $Cl_2$ gas in plasma etching for forming the recesses 22 under the condition that the flow rate of $SiCl_4$ is set to 2 sccm to 100 sccm, and the flow rate of $Cl_2$ gas is set to 5 sccm to 200 sccm. The pressure is set to 0.2 Pa to 4 Pa, the RF power is set to 20 W to 300 W, and the bias is set to 3 W to 100 W.

The parameters other than the above are the same as those of the method of the first embodiment, which have been described with reference to FIGS. 2A through 2D.

In the third embodiment, it is also possible to strengthen the physical etching function by the use of the $SiCl_4$ mixed gas as etching gas and etch aluminum oxide formed on the surface of the AlGaN electron supply layer 16. It is thus possible to realize a small RMS roughness of the bottoms of the recesses 22 and to suppress the contact resistivity to a low level.

In the third embodiment, the flow rate of $SiCl_4$ gas is preferably in the range of 2 sccm to 50 sccm, and is more preferably in the range of 2 sccm to 25 sccm. The flow rate of $Cl_2$ gas is preferably in the range of 5 sccm to 100 sccm, and is more preferably in the range of 5 sccm to 50 sccm.

The present invention is not limited to the specifically described embodiments, but includes various embodiments and variations within the scope of the claimed invention.

What is claimed is:

1. A method for fabricating a semiconductor device comprising:
    forming a recess to an AlGaN layer by etching, the AlGaN layer having an Al composition ratio of 0.2 or greater, the recess having a bottom having an RMS roughness less than 0.3 nm;
    forming a first Ta layer having a thickness of 4 nm to 8 nm on the bottom of the recess; and
    annealing the first Ta layer to make an ohmic contact in the AlGaN layer,
    wherein the etching is performed by plasma etching using an etching gas that is one of a mixed gas of boron chloride gas and chlorine gas, a mixed gas of boron chloride gas, silicon chloride gas and chloride gas, and a mixed gas of silicon chloride gas and chlorine gas.

2. The method according to claim 1, wherein the first Ta layer has a thickness of 5 nm to 7 nm.

3. The method according to claim 1, further comprising forming an Al layer on the first Ta layer before the annealing.

4. The method according to claim 3, further comprising forming a second Ta layer on the Al layer before the annealing.

5. The method according to claim 1, wherein the semiconductor device has a gate electrode, source electrode, and drain electrode, the source electrode and the drain electrode having the ohmic contact.

6. The method according to claim 1, wherein the AlGaN layer is formed on a channel layer, the channel layer being formed on a substrate.

7. The method according to claim 6, wherein the channel layer includes GaN.

8. The method according to claim 1, wherein the annealing is performed at a temperature of 500° C. to 600° C.

9. The method according to claim 1 wherein the plasma etching is reactive ion etching.

10. The method according to claim 1, wherein the first Ta layer is formed by an evaporating deposition method.

11. A method for fabricating a semiconductor device comprising:
    forming a first Ta layer on an AlGaN layer, the first Ta layer having a thickness of 4 nm to 8 nm and the AlGaN layer having an Al composition ratio of 0.2 or greater and having an RMS roughness less than 0.3 nm; and
    annealing the first Ta layer to make an ohmic contact with the AlGaN layer;
    forming an Al layer on the first Ta layer before the annealing; and
    forming a second Ta layer on the Al layer before the annealing.

12. The method according to claim 11, wherein the AlGaN layer is formed on a GaN channel layer, and the GaN channel layer is formed on a substrate.

13. The method according to claim 12, wherein the Ta layer is formed by an evaporating deposition method.

14. A method for fabricating a semiconductor device comprising:
    forming a recess to an AlGaN layer by etching, the AlGaN layer having an Al composition ratio of 0.2 or greater, the recess having a bottom having an RMS roughness less than 0.3 nm;
    forming a first Ta layer having a thickness of 4 nm to 8 nm on the bottom of the recess;
    annealing the first Ta layer to make an ohmic contact in the AlGaN layer;
    forming an Al layer on the first Ta layer before the annealing; and
    forming a second Ta layer on the Al layer before the annealing.

15. A method for fabricating a semiconductor device comprising:
    forming a recess to an AlGaN layer by etching, the AlGaN layer having an Al composition ratio of 0.2 or greater, the recess having a bottom having an RMS roughness less than 0.3 nm;
    forming a first Ta layer having a thickness of 4 nm to 8 nm on the bottom of the recess; and
    annealing the first Ta layer to make an ohmic contact in the AlGaN layer,
    wherein the etching is performed by plasma etching using an etching gas that is one of a mixed gas of boron chloride gas and chlorine gas, a mixed gas of boron chloride gas, silicon chloride gas and chloride gas, and a mixed gas of silicon chloride gas and chlorine gas, the plasma etching is an inductive coupled plasma etching under a condition of RF power of 20 W to 300 W is applied at a pressure of 0.2 Pa to 4 Pa.

16. A method for fabricating a semiconductor device comprising:

forming a first Ta layer on an AlGaN layer, the first Ta layer having a thickness of 4 nm to 8 nm and the AlGaN layer having an Al composition ratio 0.2 or greater and having an RMS roughness less than 0.3 nm;

annealing the first Ta layer to make an ohmic contact with the AlGaN layer, forming an Al layer on the first Ta layer before the annealing; and forming a second Ta layer on the Al layer before the annealing, wherein the annealing is performed at a temperature of 500° C. to 600° C.

* * * * *